(12) United States Patent
Takei et al.

(10) Patent No.: US 6,795,466 B1
(45) Date of Patent: Sep. 21, 2004

(54) DISTRIBUTED FEEDBACK TYPE SEMICONDUCTOR LASER DEVICE

(75) Inventors: Kiyoshi Takei, Tsurugashima (JP); Nong Chen, Tsurugashima (JP); Yoshiaki Watanabe, Tsurugashima (JP); Kiyofumi Chikuma, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/482,099

(22) Filed: Jan. 13, 2000

(30) Foreign Application Priority Data

Feb. 17, 1999 (JP) ............................................ 11-038281

(51) Int. Cl.[7] ................................................. H01S 5/00
(52) U.S. Cl. ............................ 372/43; 372/44; 372/45; 372/46; 372/47; 372/48; 372/49; 372/50; 372/92; 372/96; 372/102
(58) Field of Search .............................. 372/43–50, 92, 372/96, 102

(56) References Cited

U.S. PATENT DOCUMENTS

| | | | | |
|---|---|---|---|---|
| 4,894,835 A | * | 1/1990 | Uomi et al. | 372/45 |
| 5,459,747 A | * | 10/1995 | Takiguchi et al. | 372/50 |
| 5,518,955 A | * | 5/1996 | Goto et al. | 438/494 |
| 5,539,763 A | * | 7/1996 | Takemi et al. | 372/50 |
| 5,604,762 A | * | 2/1997 | Morinaga et al. | 372/43 |
| 5,684,823 A | * | 11/1997 | Goto et al. | 372/96 |
| 5,982,804 A | * | 11/1999 | Chen et al. | 372/96 |
| 5,991,322 A | * | 11/1999 | Takiguchi et al. | 372/50 |
| 6,573,116 B2 | * | 6/2003 | Watanabe et al. | 438/32 |

* cited by examiner

Primary Examiner—Don Wong
Assistant Examiner—Delma R. Flores Ruiz
(74) Attorney, Agent, or Firm—Sughrue Mion, PLLC

(57) ABSTRACT

A DFB type semiconductor laser device including a laser substrate, a grating layer, an insulating layer and an electrode layer, which are laminated in the given order. The insulating layer includes a through groove or grooves extending to the grating layer in a direction in which a resonator of the laser device is formed, and the electrode layer contacts the grating layer and a clad layer.

3 Claims, 6 Drawing Sheets

DISTRIBUTED FEEDBACK TYPE SEMICONDUCTOR LASER DEVICE

BACKGROUND OF THE INVENTION

1. Field of the Invention

The present invention relates to a method of manufacturing Distributed FeedBack (hereinafter abbreviated as "DFB") type semiconductor laser devices and to a DFB type semiconductor laser device.

2. Related Art

DFB type semiconductor laser devices are well-known as devices for use with light communications systems such as light CATV, shortwave lasers making use of SHG (Second Harmonic Generation) devices, pump light sources for small-sized solid-state lasers, light measurement arts or the like.

FIG. 1 shows a conventional DFB type semiconductor laser element. Laminated on a substrate 1 composed of $n^+$-InP are a lower clad layer 2 composed of n-InP, a lower guide layer 3, an activated layer 4, and an upper guide layer 5, which are composed of InGaAsP having different compositions. Further above the upper guide layer 5 is an upper clad layer 6 composed of p-InP partly having a ridge. Provided on flat portions on both sides of the upper clad layer 6 is a grating layer 6a and provided on top of the ridge is a contact layer 7 composed of InGaAsP. Arranged on the grating layer 6a is an inorganic protective layer 8 composed of a silicon compound such as water glass. Also, electrodes 20, 21 are formed on the contact layer 7 and on an underside of the substrate 1.

With conventional DFB type semiconductor laser devices, a ridge is formed to confine a generated light in a three dimensional space. However, a process of forming such a ridge, and a process of forming a window, which is required for an electrode to be provided on the top of the ridge, with high accuracy while aligning it, are extremely complicated and responsible for an increased cost.

The present invention has been developed in view of the above-described problem, and is aimed at providing a DFB type semiconductor laser device, which can be readily manufactured without any complicated process, and also provides a method of manufacturing the same.

A DFB type semiconductor laser device according to the present invention comprises a laser substrate, a grating layer, an insulating layer and an electrode layer, which are laminated in this order, the insulating layer including a through groove or grooves extending to the grating layer in a direction, along which a resonator of the laser device is formed, and the electrode layer contacting the grating layer and the clad layer.

Also, a method of manufacturing a DFB type semiconductor laser device, according to the present invention, comprises the steps of forming a laser substrate including at least a waveguide layer and a clad layer, forming a grating layer on the top surface of the laser substrate; forming an insulating layer having a through groove or grooves extending to the grating layer in a direction, along which a resonator of the laser device is formed, forming an electrode layer made of a high refractive material on the insulating layer, and forming a further electrode layer on the bottom surface of the laser substrate.

DESCRIPTION OF THE PREFERRED EMBODIMENTS

Embodiments of the present invention will be described below with reference to FIGS. 2 to 8.

Figure 1:
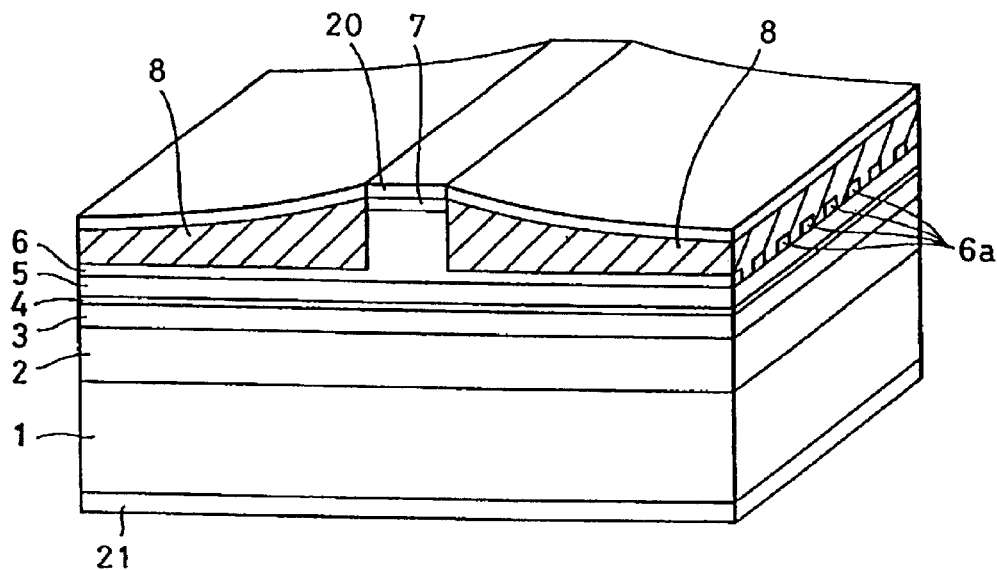
FIG. 1 is a perspective view showing a conventional DFB type semiconductor laser device.
Figure 2:
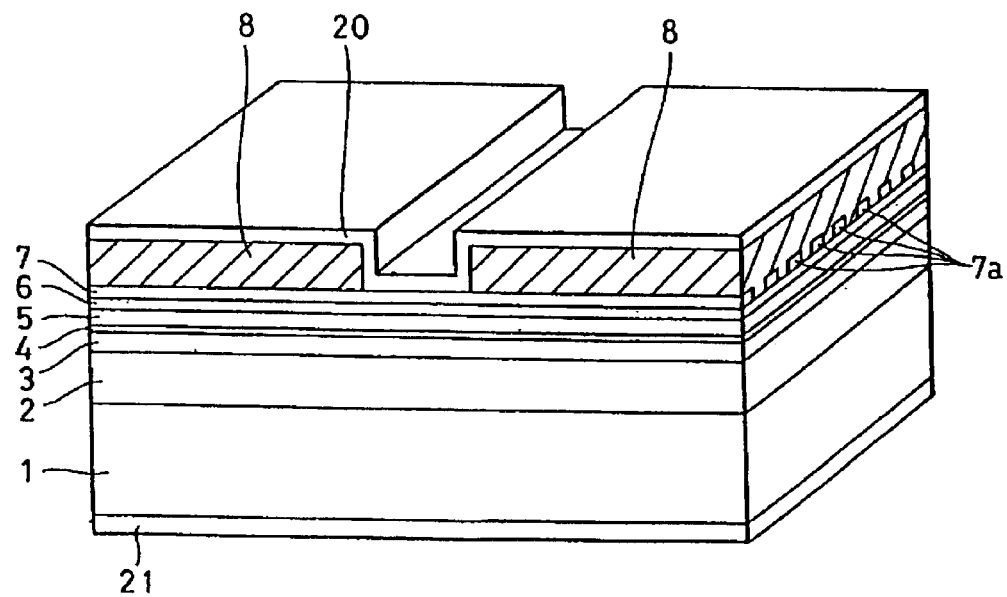
FIG. 2 is a perspective view showing a DFB type semiconductor laser device according to the present invention.

As shown in FIG. 2, a lower clad layer 2 composed of n-InP, a lower guide layer 3, an activated layer 4, and an upper guide layer 5, which are composed of InGaAsP having different compositions (these three layers are hereinafter collectively referred to as a waveguide layer), and an upper clad layer 6 composed of p-InP are laminated in this order on a substrate 1 composed of $n^+$-InP.

A contact layer 7 composed of InGaAs is formed to provide a grating layer 7a on the upper clad layer 6. The grating layer 7a is constructed such that a plurality of ridges having a substantially rectangular-shaped cross-section are aligned periodically or, in other words, at spaced intervals to a direction in which a laser resonator is formed. Here, a grating may be formed on a part of the upper clad layer 6 to provide a grating contiguous to the contact layer 7.

Further, two inorganic protective layers 8 composed of a silicon compound such as water glass are formed in strips on the grating layer 7a to be parallel to the direction in which the resonator is formed. The inorganic protective layers 8 include through grooves leading to the grating layer 7a.

Further, a p-side electrode layer 20 composed of a metal, such as Ti and Cr, having a high refractive index, is provided on the inorganic protective layers 8 and on the grating layer 7a in the through groove region of the inorganic protective layers 8. A metallic material, composing the electrode layer 20, enters the through groove region through the grating layer 7a, so that the portion of the electrode layer 20 contacts the upper clad layer 6. Also, an n-side electrode layer 21 is formed on the bottom surface of the substrate 1.

With such an arrangement, the light generated in the waveguide layer is confined by the electrode layer 20, which contacts the upper clad layer 6 and has a high refractive index. Therefore, the upper clad layer 6 must have such a thickness that the light generated in the waveguide layer can interact with the electrode layer 20, with the upper clad layer 6 therebetween. Therefore, such a thickness is preferably 0.5 $\mu$m or less.

An explanation will be given hereinafter of the method of manufacturing a semiconductor laser device, according to the present invention.

Figure 3:
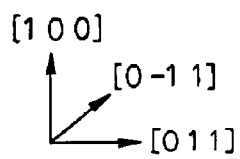
FIG. 3 is a perspective view showing a laser substrate in a process of forming a grating layer in the manufacturing method according to the present invention.
Figure 3:
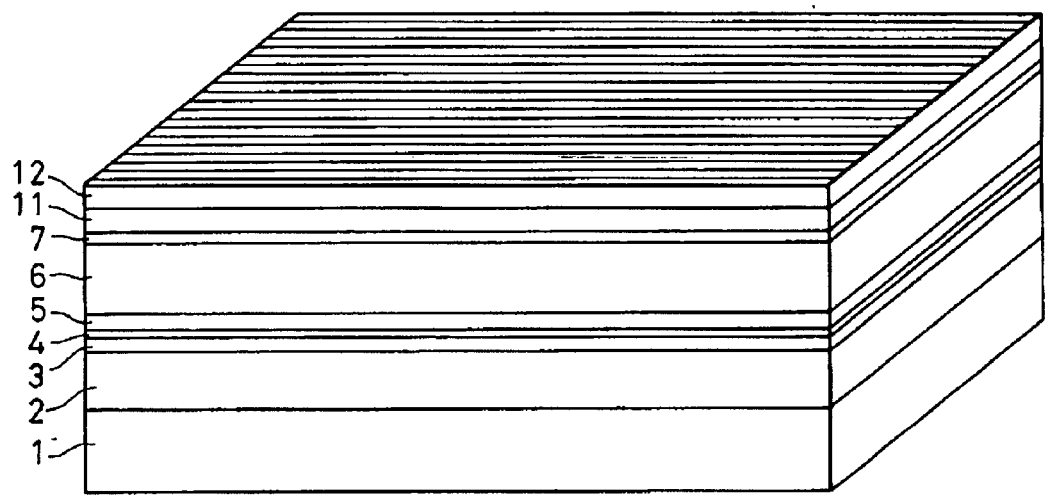
Figure 4:
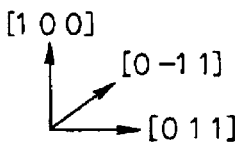
FIG. 4 is a perspective view showing a substrate in the state in which the grating layer has been formed, in the manufacturing method according to the present invention.
Figure 4:
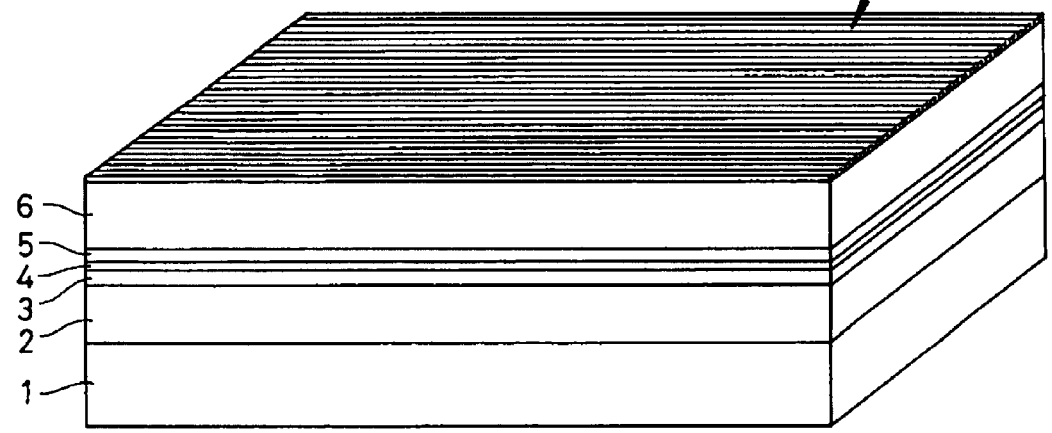

As shown in FIGS. 3 and 4, a wafer made of an InP crystal substrate having the face orientation (1 0 0) is prepared.

After the surfaces of the wafer is cleaned by chemical etching, the epitaxial growth method, the liquid phase growth method, the organic metal vapor growth method, the molecular beam growth method or the like is used to form the SCH (Separate Confinement Hetero-structure) activated layer region, the clad layer, the contact layer and so on.

For example, the lower clad layer 2 composed of n-InP is formed to provide a film, having an optional thickness, on the surface (1 0 0) of the $n^+$-InP substrate 1. The lower guide layer 3, the activated layer 4 and the upper guide layer 5, which are composed of $In_{1-x}Ga_xAs_{1-y}P_y$ having different compositions, are formed on the lower clad layer to provide a film having a total thickness of 0.2 μm.

Further, the upper clad layer 6 composed of p-InP is formed to provide a film. As described above, the upper clad layer 6 must have such a thickness that the light generated in the waveguide layer interacts with the electrode layer 20, which is on the upper clad layer 6 and has a high refractive index. Therefore, such a thickness is preferably 0.5 μm or less.

Further, the contact layer 7 composed of p-InGaAsP or $p^+$-InGaAs is formed to provide a film on the upper clad layer 6, thus forming a multilayer structured substrate having a laser construction.

Further, a protective film 11 composed of $SiO_2$ is formed on the multilayer structured substrate. The protective film 11 is useful in preventing P desorption in the multilayer structured substrate and as an etching mask. Also, the protective film 11 eat is useful in obtaining a uniform film of a high resolution EB resist, which needs high temperature baking in the next process. Subsequently, an EB draughting resist is coated on the protective film 11, and then baked to form a resist layer 12.

Here, EB draughting is performed in a cycle conformed to the laser oscillation wave length with lines along the direction [0 1 1] of the crystal orientation of the substrate 1, thus forming a latent image of a grating having a periodic construction, which changes in a cycle Λ, on the resist layer 12 in the direction [0 −1 1] of the substrate 1.

Generally, a ridge constraction in a DFB type semiconductor laser has a ridge which is provided at periodic or given intervals in a cycle Λ in a direction in which laser light is transmitted. Therefore, the refractive index also changes periodically and the reflectance increases in a wave length, in which light reflected periodically coincides in phase (Bragg reflection), so that laser oscillation is generated. Accordingly, an oscillating wave length of a DFB type semiconductor laser is determined by a cycle Λ of a periodic construction, so that a single longitudinal mode can be generally obtained in a condition in which Λ=mλ/2n is satisfied. Here, m indicates an integer, λ an oscillating wave length in vacuum, and n is an effective refractive index of a laser medium. With respect to the laser, the cycle Λ is determined taking into account refractive indexes, film thicknesses and aspect ratios of the activated layer 4, the lower clad layers 2 and 6, a reflection coefficient of a resonator (a cleavage plane), and an optically coupling factor in a transverse direction.

A process of forming the grating layer 7a comprises transferring a grating of the resist layer 12 onto the $SiO_2$ protective film 11 by means of CF4 dry etching, and performing $Cl_2$ dry etching on the contact layer 7 composed of $p^+$-InGaAs to form the grating layer 7a having a substantially rectangular-shaped cross section.

Further, the protective film 11 is removed. Electron beam lithography as well as photolithography may be used to form the grating layer 7a.

Figure 5:
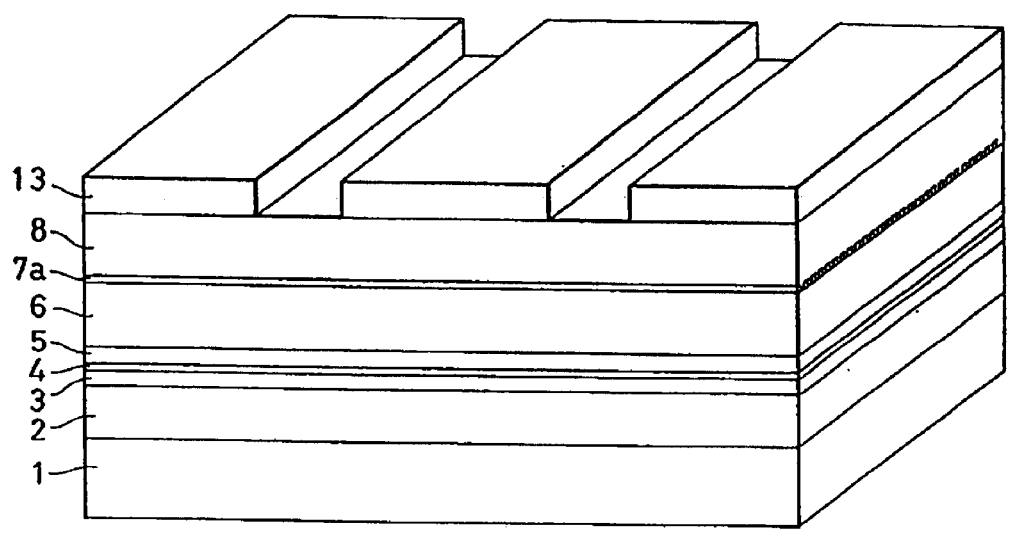
FIG. 5 is a perspective view showing a laser substrate in a process of forming through grooves on an insulating layer, in the manufacturing method according to the present invention.
Figure 6:
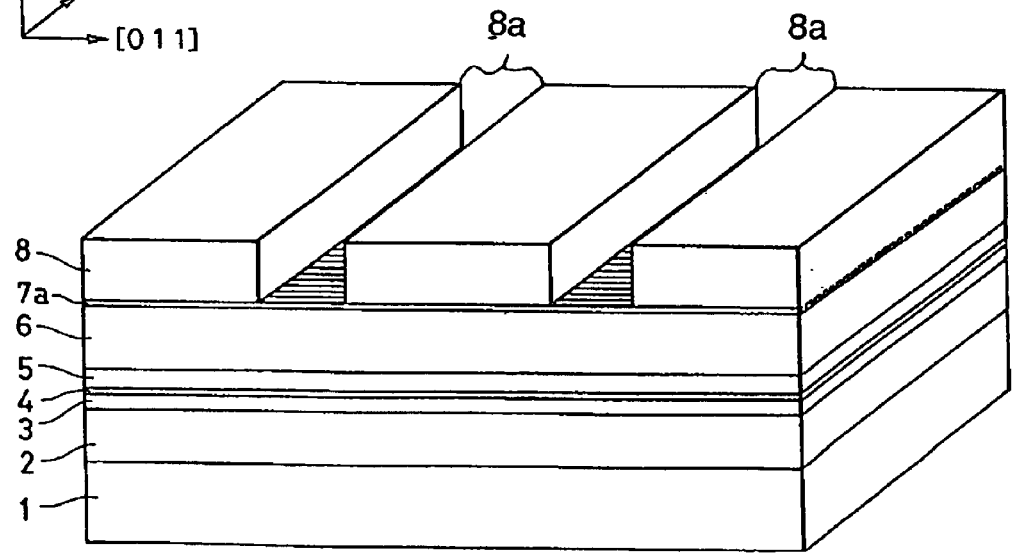
FIG. 6 is a perspective view showing a laser substrate in the state in which the through grooves are formed on the insulating layer, in the manufacturing method according to the present invention.

Subsequently, as shown in FIGS. 5 and 6, a silicon compound or the like is coated on the grating layer 7a and cured to form the inorganic protective layers 8. Further, a resist mask 13 composed of $SiO_2$, $TiO_2$ and so on is applied on the protective layers to leave gaps in a strip shape in the direction [011] of the InP crystal substrate 1. The gaps define a transverse width of the through grooves or gap 8a, which is associated in confining the light, generated in the waveguide layer, in the transverse direction. After the inorganic protective layers 8 are subjected to etching until the surface of the grating layer 7a is exposed, the resist mask 13 is removed to thereby form the through grooves on the inorganic protective layers 8.

Figure 7:
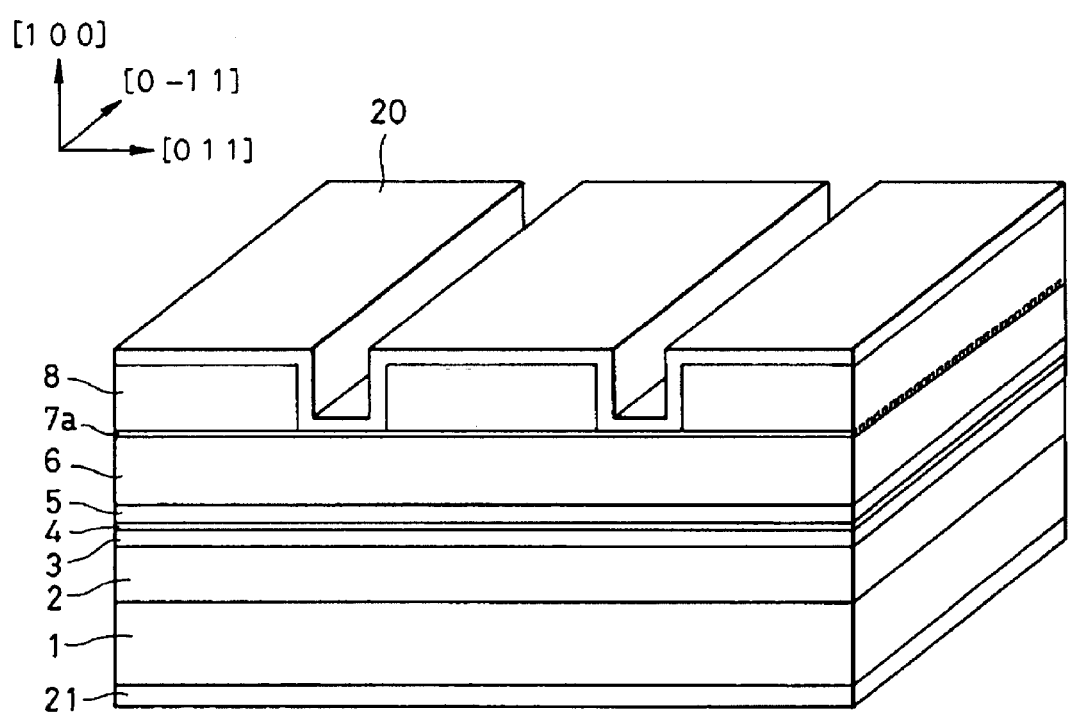
FIG. 7 is a perspective view showing a laser substrate in the state in which electrodes are vapor deposited, in the manufacturing method according to the present invention.

Subsequently, as shown in FIG. 7, the p-side electrode layer 20 composed of TI/Au having a high refractive index is vapor deposited on the inorganic protective layer 8 and the grating layer 7a. Further, the bottom surface of the substrate 1 opposite to the surface thereof, on which the waveguide layer and the like are formed is polished and the n-side electrode layer 21 composed of Ti/Au is vapor deposited on the bottom surface to provide a bulk.

Figure 8:
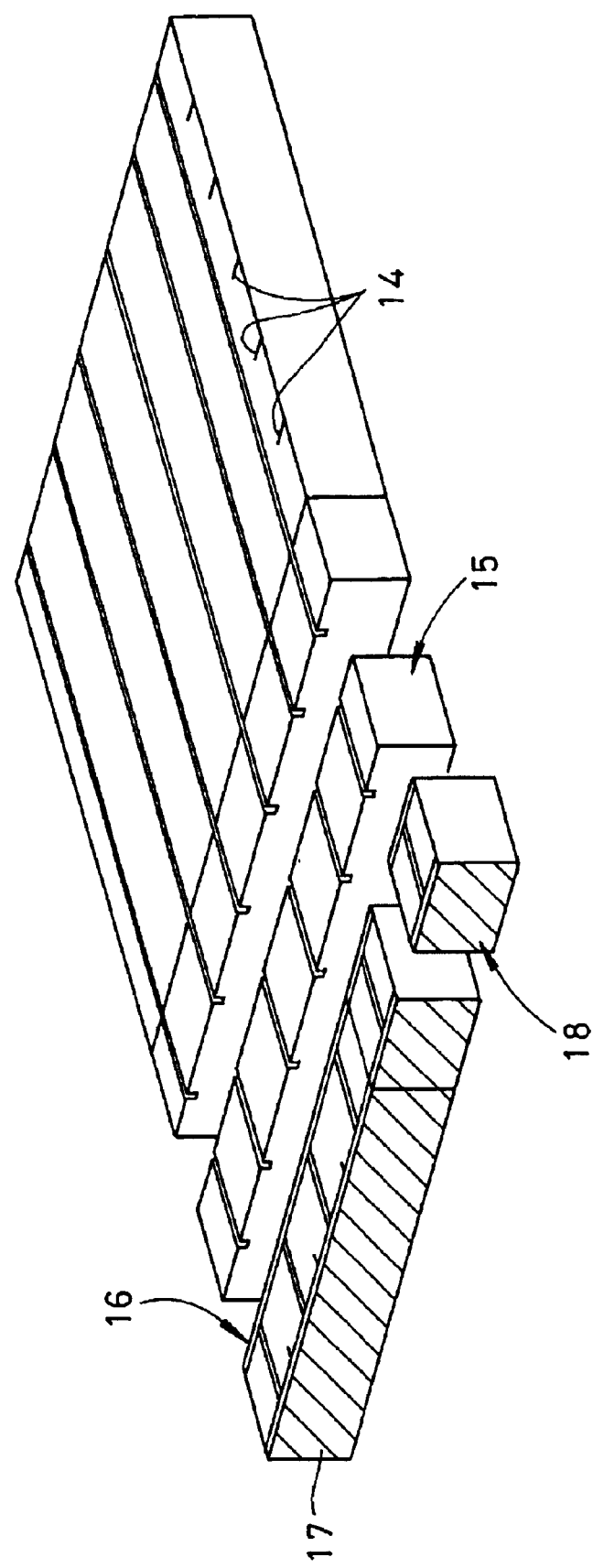
FIG. 8 is a perspective view showing a process of obtaining a finished semiconductor laser device by subdividing a bulk, in which a grating layer, an insulating layer and an electrode layer are laminated on the laser substrate, in the manufacturing method according to the present invention.

Subsequently, as shown in FIG. 8, scribe lines 14 having a length corresponding to the laser wave length are marked on an end of the bulk thus formed in the above described manner, and the bulk is subdivided into bar-shaped bodies 15 with the scribe lines 14 as origins. Further, AR coating and HR coating are applied on end surfaces 16, 17 of the bar-shaped bodies extending in a direction in which a resonator is defined and the bar-shaped bodies thus coated are cleaved to provide DFB type semiconductor laser devices 18.

Figure 9:
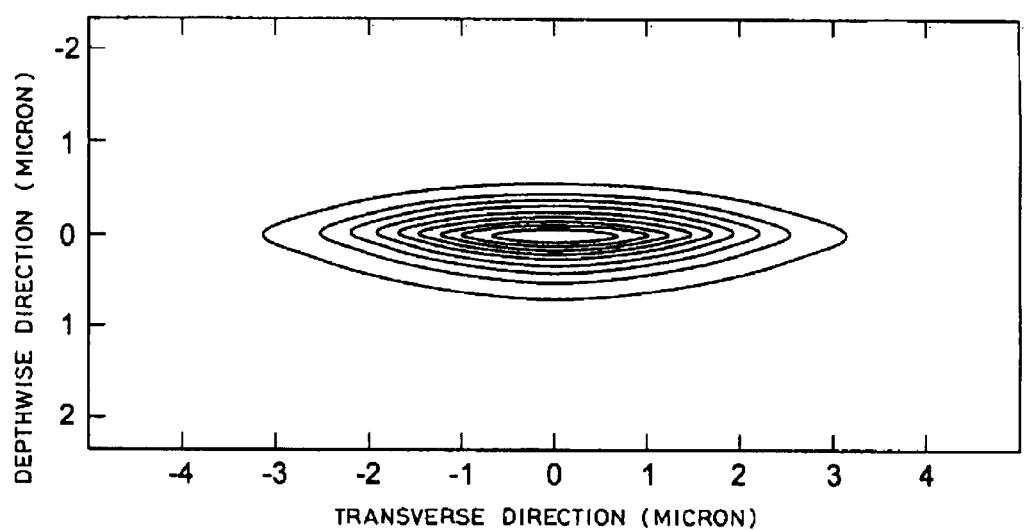
FIG. 9 is a view showing the power distribution of a semiconductor laser device according to the present invention.
Figure 9:
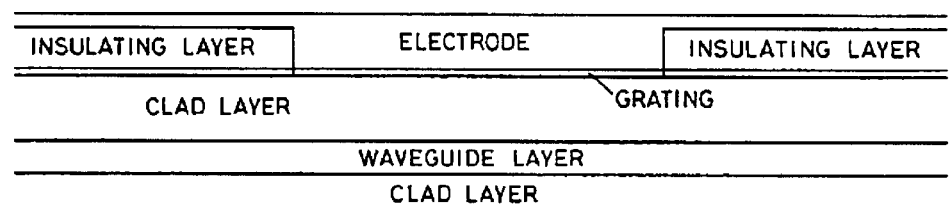

FIG. 9 is a view showing a power distribution of a semiconductor laser device thus obtained in the direction in which the resonator is formed. In the drawing, a center of the waveguide layer is taken as an origin. Also, thicknesses of the upper clad layer 6, the contact layer 7 and the inorganic protective layers 8 and a transverse width of the through grooves are 0.4 μm, 0.05 μm, 0.5 μm and 4 μm, respectively. It is found that the laser light generated is confined in lower portions of the through groove region on the insulating layer in a three dimensional fashion.

The invention can attain confinement of generated light in the three dimensional fashion without the formation of any ridge. Therefore, production efficiency is enhanced because any complicated process or the like for formation of such a ridge is not needed.

What is claimed is:

1. A DFB type semiconductor laser device comprising:
   a laser part including an active layer and a clad layer;
   a grating layer mounted on said clad layer and having periodic apertures;
   an insulating layer mounted on said grating layer, said insulating layer including at least one elongated gap extending in a direction transverse to a grating of said grating layer; and
   a metal electrode layer mounted on said insulating layer so as to contact through said apertures of said grating layer with said clad layer within said gap.

2. The DFB type semiconductor laser device according to claim 1, wherein the active layer is composed of at least InGaAsP and the clad layer is composed of p-InP, and the grating layer is composed of InGaAs.

3. The DFB type semiconductor laser device according to claim 2, wherein the clad layer has a thickness equal to or thinner than 0.5 μm.

* * * * *